US012803514B2

(12) United States Patent
Nakamura et al.

(10) Patent No.: US 12,803,514 B2
(45) Date of Patent: Nov. 17, 2026

(54) AMPLIFIER CIRCUIT, DIFFERENTIAL AMPLIFIER CIRCUIT, RECEPTION CIRCUIT, AND SEMICONDUCTOR INTEGRATED CIRCUIT

(71) Applicant: Socionext Inc., Kanagawa (JP)

(72) Inventors: Ryoichiro Nakamura, Yokohama (JP); Masahiro Kudo, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 693 days.

(21) Appl. No.: 18/061,757

(22) Filed: Dec. 5, 2022

(65) Prior Publication Data

US 2023/0095506 A1 Mar. 30, 2023

Related U.S. Application Data

(63) Continuation of application No. PCT/JP2020/023110, filed on Jun. 11, 2020.

(51) Int. Cl.
*H03F 3/45* (2006.01)
*H03F 1/08* (2006.01)
*H03F 1/32* (2006.01)

(52) U.S. Cl.
CPC ......... *H03F 3/45475* (2013.01); *H03F 1/086* (2013.01); *H03F 1/3205* (2013.01);
(Continued)

(58) Field of Classification Search
CPC .. H03F 3/45475; H03F 1/086; H03F 3/45183; H03F 1/3211; H03F 2200/474;
(Continued)

(56) References Cited

U.S. PATENT DOCUMENTS 5,363,065 A 11/1994 Dufour
5,764,086 A 6/1998 Nagamatsu et al.
(Continued)

FOREIGN PATENT DOCUMENTS

CN 1947200 A * 4/2007 ........... G11C 7/1006
CN 201042006 Y * 3/2008
(Continued)

OTHER PUBLICATIONS

International Search Report (ISR) dated Sep. 8, 2020 issued in International Patent Application No. PCT/JP2020/023110, with English translation.

*Primary Examiner* — Andrea Lindgren Baltzell
*Assistant Examiner* — Lance Torbjorn Bartol
(74) *Attorney, Agent, or Firm* — Rimon P.C.

(57) ABSTRACT

An amplifier circuit according to an embodiment includes a first circuit, a second circuit, and a third circuit. The first circuit includes a first transistor connected between an input node through which an input current flows and a reference potential node. The first transistor has a gate electrode connected to the input node. The second circuit includes a low-pass filter circuit and a second transistor connected in parallel to the first transistor between the input node and the reference potential node. The second transistor has a gate electrode connected to the gate electrode of the first transistor via the low-pass filter circuit. The third circuit includes a third transistor connected between an output node through which an output current flows and the reference potential node, the third circuit having a gate electrode connected to the gate electrode of the first transistor.

30 Claims, 9 Drawing Sheets

(52) U.S. Cl.
CPC ....... *H03F 1/3211* (2013.01); *H03F 3/45183* (2013.01); *H03F 2200/267* (2013.01); *H03F 2200/474* (2013.01); *H03F 2203/45018* (2013.01); *H03F 2203/45031* (2013.01); *H03F 2203/45032* (2013.01)

(58) Field of Classification Search
CPC .... H03F 3/347; H03F 3/45273; H03F 1/3205; H03F 2200/267; H03F 2203/45018; H03F 2203/45031; H03F 2203/45032
USPC .......................................................... 330/253
See application file for complete search history.

(56) References Cited

U.S. PATENT DOCUMENTS

| | | | | |
|---|---|---|---|---|
| 6,492,874 | B1 | 12/2002 | Shih | |
| 6,545,540 | B1 | 4/2003 | Enriquez | |
| 6,995,612 | B1 * | 2/2006 | Chen | G05F 3/262 330/288 |
| 7,724,092 | B2 * | 5/2010 | Quan | H03F 3/45273 330/288 |
| 8,093,952 | B2 * | 1/2012 | Behzad | H03F 3/45183 330/288 |
| 2008/0024228 | A1 | 1/2008 | Lee | |
| 2009/0146741 | A1 | 6/2009 | Okuma | |
| 2009/0160420 | A1 * | 6/2009 | Kudo | G05F 3/262 323/315 |

FOREIGN PATENT DOCUMENTS

| | | | | | |
|---|---|---|---|---|---|
| CN | 106505995 | A | * | 3/2017 | G06F 7/501 |
| JP | H09-074340 | A | | 3/1997 | |
| JP | 2005-526412 | A | | 9/2005 | |
| JP | 2009-165100 | A | | 7/2009 | |

* cited by examiner

FIG.9A

| a | 0 | 1 | 2 | 3 | 4 | 5 |
|---|---|---|---|---|---|---|
| 0 | 32 | 29 | 25 | 23 | 20 | 18 |
| 1 | 30 | 27 | 24 | 22 | 20 | 18 |
| 2 | 29 | 26 | 24 | 21 | 19 | 18 |
| 3 | 27 | 25 | 22 | 21 | 19 | 17 |
| 4 | 26 | 24 | 22 | 20 | 19 | 17 |
| 5 | 25 | 23 | 21 | 20 | 18 | 17 |
| 6 | 24 | 22 | 21 | 19 | 18 | 17 |
| 7 | 23 | 21 | 20 | 19 | 18 | 17 |
| 8 | 22 | 21 | 20 | 19 | 18 | 17 |
| 9 | 22 | 21 | 20 | 18 | 18 | 17 |

EQ

VGA

FIG.9B

| b | 0 | 1 | 2 | 3 | 4 | 5 |
|---|---|---|---|---|---|---|
| 0 | 0 | 3 | 7 | 9 | 12 | 14 |
| 1 | 0 | 3 | 6 | 8 | 10 | 12 |
| 2 | 0 | 3 | 5 | 8 | 10 | 11 |
| 3 | 0 | 2 | 5 | 6 | 8 | 10 |
| 4 | 0 | 2 | 4 | 6 | 7 | 9 |
| 5 | 0 | 2 | 4 | 5 | 7 | 8 |
| 6 | 0 | 2 | 3 | 5 | 6 | 7 |
| 7 | 0 | 2 | 3 | 4 | 5 | 6 |
| 8 | 0 | 1 | 2 | 3 | 4 | 5 |
| 9 | 0 | 1 | 2 | 4 | 4 | 5 |

EQ

VGA

FIG.9C

| c | 0 | 1 | 2 | 3 | 4 | 5 |
|---|---|---|---|---|---|---|
| 0 | 0 | 0 | 0 | 0 | 0 | 0 |
| 1 | 2 | 2 | 2 | 2 | 2 | 2 |
| 2 | 3 | 3 | 3 | 3 | 3 | 3 |
| 3 | 5 | 5 | 5 | 5 | 5 | 5 |
| 4 | 6 | 6 | 6 | 6 | 6 | 6 |
| 5 | 7 | 7 | 7 | 7 | 7 | 7 |
| 6 | 8 | 8 | 8 | 8 | 8 | 8 |
| 7 | 9 | 9 | 9 | 9 | 9 | 9 |
| 8 | 10 | 10 | 10 | 10 | 10 | 10 |
| 9 | 10 | 10 | 10 | 10 | 10 | 10 |

EQ

VGA

AMPLIFIER CIRCUIT, DIFFERENTIAL AMPLIFIER CIRCUIT, RECEPTION CIRCUIT, AND SEMICONDUCTOR INTEGRATED CIRCUIT

CROSS-REFERENCE TO RELATED APPLICATIONS

This application is a continuation of International Application No. PCT/JP2020/023110, filed on Jun. 11, 2020, the entire contents of which are incorporated herein by reference.

FIELD

An embodiment disclosed in the present specification and the like relates to, for example, an amplifier circuit, a differential amplifier circuit, a reception circuit, and a semiconductor integrated circuit used for a continuous time linear equalizer (CTLE).

BACKGROUND

The CTLE is an input amplifier circuit of a serializer/deserializer (SerDes) reception circuit used for a high-speed interface for a network or a data center, and is used as a loss compensation circuit in a transmission path. The conventional CTLE uses a source degeneration equalizer.

Conventional techniques are described in Japanese Patent Application Laid-Open No. 9-74340, US Patent Application Publication No. 2008/24228, and U.S. Pat. No. 5,363,065.

However, the conventional CTLE using the source degeneration equalizer enables a boost gain amplification function using an inductor element (coil). Therefore, the circuit size (area) is large. In addition, the gain is nonlinear due to variations in factors such as resistance and transconductance in the circuit.

In recent years, due to the miniaturization of the CMOS technology, further reduction in power consumption of the CTLE and further reduction in area of the CTLE are required. In addition, high linearity is required due to multi-leveling of the signal amplitude level.

One of the problems to be solved by the embodiments disclosed in the present specification and the like is to provide an amplifier circuit, a differential amplifier circuit, a reception circuit, and a semiconductor integrated circuit that enable a boost gain amplification function and have a small area while maintaining linearity of a gain.

SUMMARY

An amplifier circuit according to an embodiment includes: a first circuit including a first transistor connected between an input node through which an input current flows and a reference potential node, the first transistor having a gate electrode connected to the input node; a second circuit including a low-pass filter circuit and a second transistor connected in parallel to the first transistor between the input node and the reference potential node, the second transistor having a gate electrode connected to the gate electrode of the first transistor via the low-pass filter circuit; and a third circuit including a third transistor connected between an output node through which an output current flows and the reference potential node, the third circuit having a gate electrode connected to the gate electrode of the first transistor.

BRIEF DESCRIPTION OF THE DRAWINGS

FIGS. 9A, 9B, and 9C are lookup tables for determining size parameters based on a DC gain and a boost gain;

DETAILED DESCRIPTION

Figure 1:
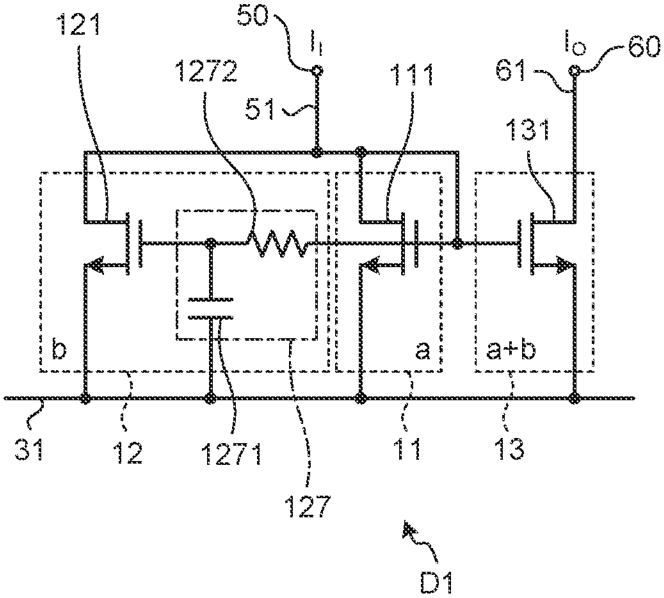
FIG. 1 is a diagram illustrating a configuration of an amplifier circuit according to a first embodiment.

Hereinafter, an amplifier circuit, a differential amplifier circuit, a reception circuit, and a semiconductor integrated circuit according to embodiments will be described in detail with reference to the accompanying drawings. Note that the present invention is not limited by this embodiment. In the following description, the same reference numerals are given to portions common to the drawings, and a detailed description thereof will be omitted.

First Embodiment

FIG. 1 is a diagram illustrating a configuration of an amplifier circuit D1 according to a first embodiment. The amplifier circuit D1 is a single-ended amplifier.

As illustrated in FIG. 1, the amplifier circuit D1 includes a first circuit 11, a second circuit 12, a third circuit 13, a reference potential node 31, an input terminal 50, an input node 51, an output terminal 60, and an output node 61. In FIGS. 1, *a* and *b* are parameters indicating magnitudes of currents flowing through transistors of the first circuit 11 and second circuit 12, respectively, and are parameters (hereinafter, referred to as "size parameters") indicating sizes of the transistors. Each of the size parameters a and b corresponds to, for example, the number of fins of a fin field effect transistor (FinFET) or the gate width of a planar transistor.

The input node 51 includes a wiring through which an input current $I_I$ flows. The output node 61 includes a wiring through which an output current $I_o$ flows. The reference potential node 31 includes a wiring to which a reference potential Vbasis (for example, ground potential) is supplied. Note that the potential Vin of the input node 51 and the reference potential Vbasis have a relationship of Vin>Vbasis.

The first circuit 11 includes a first transistor 111. The first transistor 111 is, for example, an n-channel transistor, and is connected between the input node 51 through which the input current $I_I$ flows and the reference potential node 31. The gate electrode of the first transistor 111 is connected to the input node 51. The drain electrode and source electrode of the first transistor 111 are connected to the input node 51 and the reference potential node 31, respectively. The size parameter of the first transistor 111 is a. The first transistor 111 is an example of a first transistor.

The second circuit 12 includes a second transistor 121 and a low-pass filter circuit 127. The second transistor 121 is, for example, an n-channel transistor, and is connected in parallel to the first transistor 111 between the input node 51 through which the input current $I_I$ flows and the reference potential node 31. The gate electrode of the second transistor 121 is connected to the gate electrode of the first transistor 111 via the low-pass filter circuit 127. The drain electrode and source electrode of the second transistor 121 are connected to the input node 51 and the reference potential node 31, respectively. The size parameter of the second transistor 121 is b. The second transistor 121 is an example of a second transistor.

The low-pass filter circuit 127 is a low-pass filter including a capacitor 1271 and a resistor 1272. The low-pass filter circuit 127 filters a signal to the gate electrode of the second transistor 121 in a high-frequency band.

Note that the frequency band passed by the low-pass filter circuit 127, that is, the cutoff frequency $\omega_z$ of the low-pass filter circuit 127 can be adjusted by the capacitance C of the capacitor 1271 and the resistance value R of the resistor 1272 ($\omega_z$=1/RC). In addition, FIG. 1 illustrates a configuration in which the low-pass filter circuit 127 includes one capacitor 1271 and one resistor 1272. However, the numbers of capacitors 1271 and resistors 1272 can be arbitrarily selected according to the purpose.

The third circuit 13 includes a third transistor 131. The third transistor 131 is, for example, an n-channel transistor, and is connected between the output node 61 through which the output current $I_o$ flows and the reference potential node 31. The gate electrode of the third transistor 131 is connected to the gate electrode of the first transistor 111. The size parameter of the third transistor 131 is a+b. That is, the size parameter a+b of the third transistor 131 is equal to the sum of the size parameter a of the first transistor 111 and the size parameter b of the second transistor 121. The third transistor 131 is an example of a third transistor.

The first circuit 11 and the second circuit 12 constitute a current mirror circuit together with the third circuit 13. When the input current $I_I$ flows to the input node 51, a current $I_{a+b}$ in a ratio corresponding to the size parameter a+b of the third transistor 131 flows through the third circuit 13 as a mirror destination.

Figure 2:
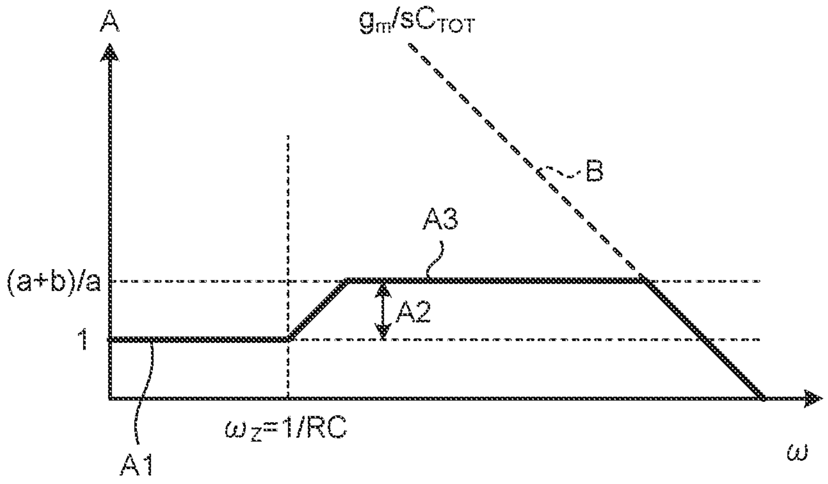
FIG. 2 is a diagram illustrating a relationship between a DC gain, a boost gain, a peak gain, and a frequency of the amplifier circuit according to the first embodiment.

Next, the operation of the amplifier circuit D1 will be described with reference to FIGS. 1 and 2. FIG. 2 is a diagram illustrating a relationship between a DC gain, a boost gain, a peak gain, and a frequency of the amplifier circuit D1 according to the first embodiment. Here, the DC gain corresponds to a gain that does not reflect the filtering operation of the low-pass filter circuit 127, and corresponds to a gain in a case where the frequency of the input current $I_I$ is lower than the cutoff frequency of the low-pass filter circuit 127. The peak gain corresponds to a gain reflecting the filtering operation of the low-pass filter circuit 127, and corresponds to a gain in a case where the frequency of the input current $I_I$ is higher than the cutoff frequency of the low-pass filter circuit 127. The boost gain corresponds to a difference between the peak gain and the DC gain, and is defined by the boost gain=the peak gain—the DC gain.

In the amplifier circuit D1, the gain (peak gain) in a case where the frequency of the input current $I_I$ is higher than the cutoff frequency of the low-pass filter circuit 127 is larger than the gain (DC gain) in a case where the frequency of the input current $I_I$ is lower than the cutoff frequency of the low-pass filter circuit 127.

More specifically, first, a case where the frequency ω of the input current $I_I$ as an input signal has a relationship of $\omega \leq \omega_z$=1/RC (that is, a case where the frequency is equal to or lower than the cutoff frequency $\omega_z$ of the low-pass filter circuit 127) is assumed. In such a case, the input signal passes through the low-pass filter circuit 127. Therefore, when the input current $I_I$ is input to the input node 51, a current $I_a$ in a ratio corresponding to the size parameter a of the first transistor 111 flows through the first circuit 11, and a current $I_b$ in a ratio corresponding to the size parameter b of the second transistor 121 flows through the second circuit 12.

In the third transistor 131, the first transistor 111, and the second transistor 121, the voltages between the gates and the sources are equal. Therefore, the current is converted by the same overdrive voltage $V_{od}$ based on a current mirror operation, and the drain current $I_{a+b}$ flows through the third transistor 131 as a mirror current. Therefore, the DC gain in a case where the input signal has a low frequency is $A1=I_{a+b}/(I_a+I_b)=(a+b)/(a+b)=1$ as illustrated in FIG. 2.

In addition, a case where the frequency ω of the input current $I_I$ as the input signal has a relationship of $\omega > w_z$=1/RC (that is, a case where the frequency is higher than the cutoff frequency $\omega_z$ of the low-pass filter circuit 127) is assumed. In such a case, when the input current $I_I$ is input to the input node 51, the drain current $I_{a+b}$ flows as a mirror current through the third transistor 131 based on the current mirror operation. At this time, the current $I_a$ in the ratio corresponding to the size parameter a of the first transistor 111 flows through the first circuit 11. On the other hand, the gate electrode of the second transistor 121 is connected to the gate electrode of the first transistor 111 via the low-pass filter circuit 127. As a result, since the input signal to the gate electrode of the second transistor 121 is filtered by the low-pass filter circuit 127, the current $I_b$ does not flow through the second transistor 121. Therefore, as illustrated in FIG. 2, in a case where the frequency ω of the input signal>$\omega_z$=1/RC, the gain increases from the DC gain by the boost gain A2 in a certain high frequency range in which the frequency ω of the input signal satisfies $\omega_z$>1/RC. As a result, $A3=I_{a+b}/I_a=(a+b)/a$.

In the amplifier circuit D1, the difference between the gain (peak gain) in a case where the frequency of the input current $I_I$ is higher than the cutoff frequency of the low-pass filter circuit 127 and the gain (DC gain) in a case where the frequency of the input current $I_I$ is lower than the cutoff frequency of the low-pass filter circuit 127 can be determined according to the size parameter b of the second transistor 121.

Furthermore, the boundary point $\omega_z$=1/RC between the DC gain A1 and the boost gain A2 can be set at a desired position by adjusting the resistance value R and the capacitance C of the low-pass filter circuit 127. In addition, a straight line B is a straight line indicating the frequency characteristics of the portion where the gain decreases, and $A=g_m/SC_{TOT}$. Here, gm is a transconductance, s is a variable of Laplace transform, and $C_{TOT}$ is a value of the total capacitance of the gate terminal.

As described above, the amplifier circuit D1 according to the present embodiment includes the first circuit 11, the second circuit 12, and the third circuit 13. The first circuit 11 includes the first transistor 111 connected between the input node 51 through which the input current flows and the reference potential node 31, and having the gate electrode connected to the input node 51. The second circuit 12 includes the low-pass filter circuit 127. The second circuit 12 includes the second transistor 121 connected in parallel to the first transistor 111 between the input node 51 and the reference potential node 31, and having the gate electrode connected to the gate electrode of the first transistor 111 via the low-pass filter circuit 127. The third circuit 13 includes the third transistor 131 connected between the output node 61 through which the output current flows and the reference potential node 31, and having the gate electrode connected to the first transistor 111.

When the frequency of the input current $I_I$ as the input signal is a high frequency, the input signal to be input to the gate electrode of the second transistor 121 is filtered by the low-pass filter circuit 127. Therefore, in the high frequency band, the current $I_b$ can be prevented from flowing through the second transistor 121, and the amplification factor can be increased from the DC gain to the peak gain.

In addition, the amplifier circuit D1 does not require an inductor element (coil). Therefore, as compared with a conventional amplifier circuit using an inductor element (coil), a circuit area can be reduced, and power consumption can be reduced.

The amplifier circuit D1 is based on a current mirror circuit manufactured by the same process. In general, input and output variation factors (for example, parameters such as the threshold value Vth and the gain coefficient β of a transistor) in an integrated circuit vary similarly within the same process. Therefore, even if variations occur, these variation factors cancel each other due to similar changes, and an amplifier circuit with a small gain error can be finally fabricated.

Furthermore, for example, in the case of a conventional source degeneration type equalizer that varies the DC gain and the boost gain using the resistance (resistance value $R_S$), the capacitance (capacitance $C_S$), the parasitic resistance (resistance value $R_p$) of the inductor, and the load resistance (resistance value $R_L$), the DC gain $A_v$ can be expressed as $A_v=(R_L+R_p)/(1/g_m+R_S)$ using the transconductances $g_m$, $R_S$, $R_p$, and $R_L$. That is, since $g_m$ is nonlinear, the DC gain $A_v$ of the conventional source degeneration type equalizer does not become linear.

On the other hand, the amplification factor $A_i$ of the amplifier circuit D1 based on the current mirror circuit can have linearity as follows.

That is, there is a relationship of Equation (1) between the current $I_{in}$ of the input signal and the overdrive voltage $V_{od}$.

$$I_{in} = (2I_{in}/\beta_{in})^{1/2} = V_{od} \tag{1}$$

Here, $\beta_{in}$ is a gain coefficient of the transistor of the mirror source. The gain coefficient β of the transistor is defined by the following Equation (2).

$$\beta = \mu C_{ox}\{W(or\ nfin)/L\} \sim \{W(or\ nfin)/L\} \tag{2}$$

Note that μ represents the carrier mobility, $C_{ox}$ represents the capacitance of the gate oxide film, W represents the gate width of the planar transistor, L represents the gate length, and nfin represents the number of fins of the FinFET.

That is, there is a relationship of Equation (3) between the current $I_{out}$ of the output signal and the overdrive voltage $V_{od}$.

$$I_{out} = (\beta_{out}/2)V_{od}^2 \tag{3}$$

Here, $\beta_{out}$ is a gain coefficient of the transistor of the mirror destination.

From Equation (3) and Equation (1), the following Equation (4) is established.

$$\begin{aligned} I_{out} &= (\beta_{out}/2)\cdot\{(2I_{in}/\beta_{in})^{1/2}\}^2 \\ &= (\beta_{out}/\beta_{in})I_{in} \end{aligned} \tag{4}$$

Therefore, the amplification factor $A_i$ of the amplifier circuit D1 is expressed by the following Equation (5) and is linear.

$$A_i = (\beta_{out}/\beta_{in}) \tag{5}$$

Second Embodiment

Figure 3:
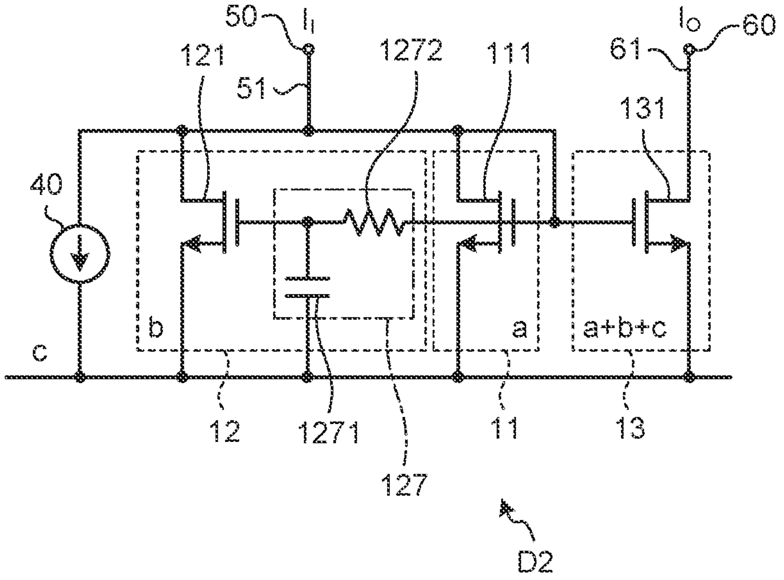
FIG. 3 is a diagram illustrating a configuration of an amplifier circuit according to a second embodiment.

FIG. 3 is a diagram illustrating a configuration of an amplifier circuit D2 according to a second embodiment. As illustrated in FIG. 3, in addition to the configuration of the amplifier circuit D1 illustrated in FIG. 1, the amplifier circuit D2 further includes a constant current source 40 that outputs a current $I_c$ in a ratio corresponding to a size parameter c to the input node 51 side. The constant current source 40 is connected in parallel to the first transistor 111 and the second transistor 121 between the input node 51 and the reference potential node 31. In addition, in the amplifier circuit D2, the size parameter of the third transistor 131 is a+b+c on the output node 61 side, corresponding to the addition of the constant current source 40.

Figure 4:
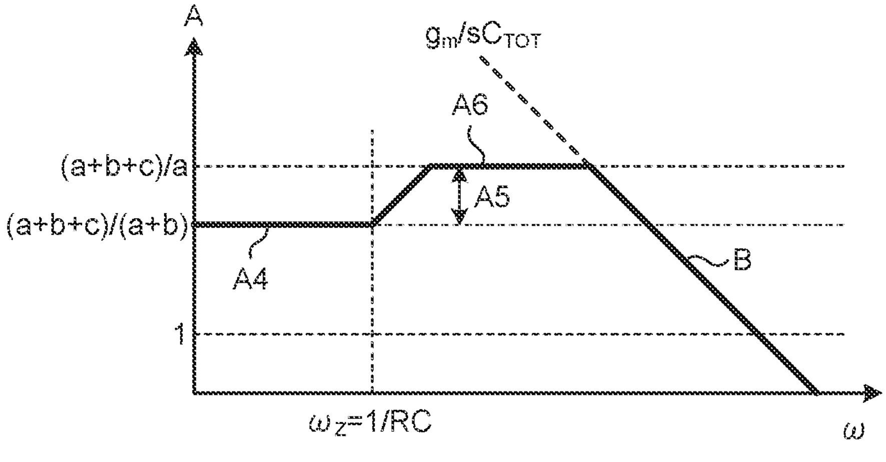
FIG. 4 is a diagram illustrating a relationship between a DC gain, a boost gain, a peak gain, and a frequency of the amplifier circuit according to the second embodiment.

FIG. 4 is a diagram illustrating a relationship between a DC gain, a boost gain, a peak gain, and a frequency of the amplifier circuit D2 according to the second embodiment. The operation of the amplifier circuit D2 will be described with reference to FIGS. 3 and 4.

The third circuit 13, the first circuit 11, the second circuit 12, and the constant current source 40 operate as a current mirror circuit. When the input current $I_I$ flows to the input node 51, a current $I_{a+b+c}$ in a ratio corresponding to the size parameter a+b+c of the third transistor 131 flows through the third circuit 13 as a mirror destination.

First, a case where the frequency ω of the input current $I_I$ as an input signal has a relationship of $\omega \le \omega_z = 1/RC$ (that is, a case where the frequency is equal to or lower than the cutoff frequency $\omega_z$ of the low-pass filter circuit 127) is assumed. In such a case, since the input signal passes through the low-pass filter circuit 127, when the input current $I_I$ is input to the input node 51, a current $I_a$ in a ratio corresponding to the size parameter a flows through the first transistor 111, and a current $I_b$ in a ratio corresponding to the size parameter b flows through the second transistor 121. Based on the current mirror operation, a drain current $I_{a+b+c}$ flows through the third transistor 131 as a current mirror destination. Therefore, the DC gain in a case where the input signal has a frequency $\omega \leq \omega_z = 1/RC$ is $A4 = I_{a+b+c}/(I_a + I_b) = (a+b+c)/(a+b)$ as illustrated in FIG. 4.

In addition, a case where the frequency ω of the input current $I_I$ as the input signal has a relationship of $w > w_z = 1/RC$ (that is, a case where the frequency is higher than the cutoff frequency $\omega_z$ of the low-pass filter circuit 127) is assumed. In such a case, when the input current $I_I$ is input to the input node 51, the drain current $I_{a+b+c}$ flows through the third transistor 131 as the mirror destination based on the current mirror operation. At this time, the current $I_a$ in the ratio corresponding to the size parameter a of the first transistor 111 flows through the first circuit 11. On the other hand, since the input signal to the gate electrode of the second transistor 121 is filtered by the low-pass filter circuit 127, the current $I_b$ does not flow through the second transistor 121. Therefore, as illustrated in FIG. 4, in a case where the frequency ω of the input signal$>\omega_z = 1/RC$, the gain increases from the DC gain by the boost gain A5 in a certain high frequency range in which the frequency ω of the input signal satisfies $\omega_z > 1/RC$. As a result, the peak gain becomes $A6 = I_{a+b+c}/I_a = (a+b+c)/a$.

That is, the amplifier circuit D2 according to the second embodiment can amplify not only the boost gain but also the DC gain. In addition, the boost gain and the DC gain can be variably amplified by adjusting the current $I_c$ output from the constant current source 40. In addition, the boost gain can be further amplified as compared with the amplifier circuit D1 according to the first embodiment.

Third Embodiment

Figure 5:
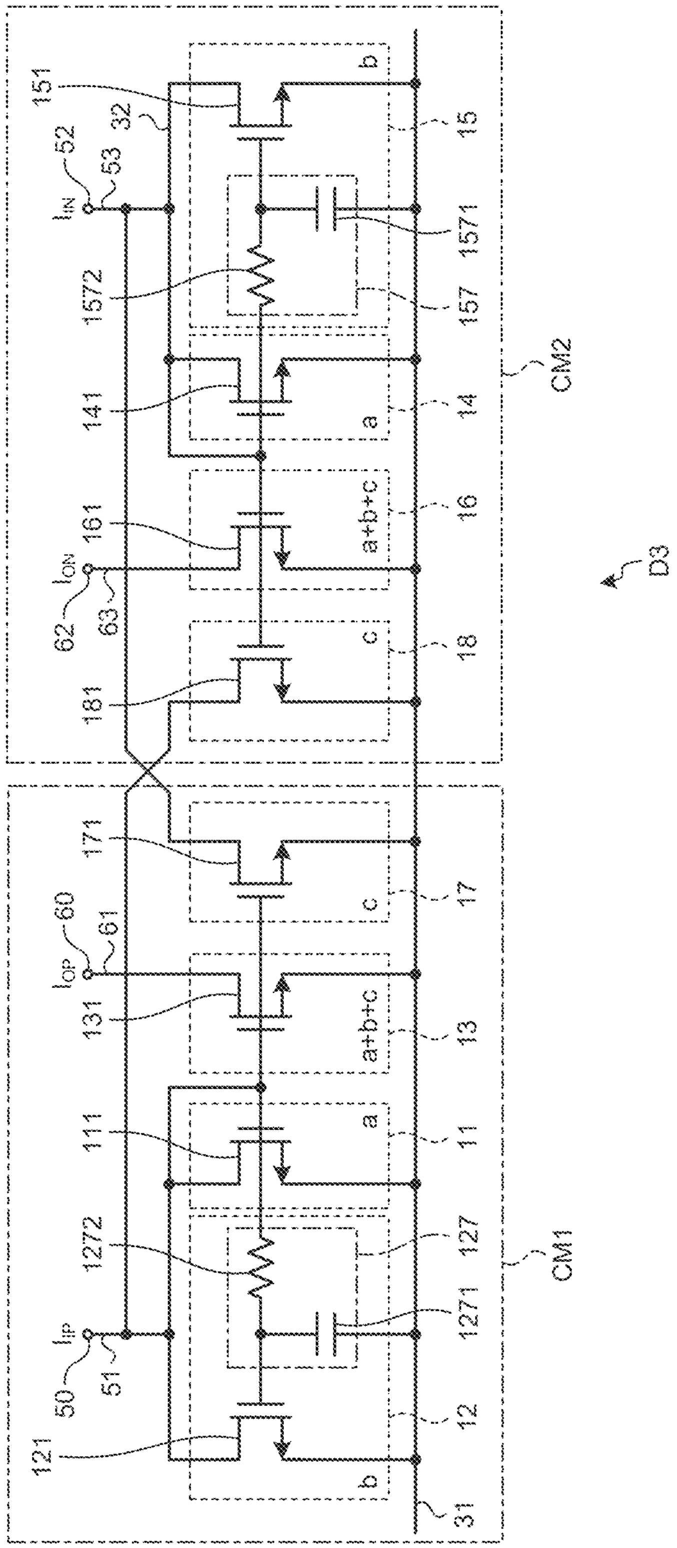
FIG. 5 is a diagram illustrating a configuration of an amplifier circuit according to a third embodiment.

FIG. 5 is a diagram illustrating a configuration of an amplifier circuit D3 according to a third embodiment. As illustrated in FIG. 5, the amplifier circuit D3 is a differential amplifier that receives input currents $I_{IP}$ and $I_{IN}$ from input terminals 50 and 52 and outputs output currents $I_{OP}$ and $I_{ON}$ from output terminals 60 and 62.

The amplifier circuit D3 includes a first circuit 11, a second circuit 12, a third circuit 13, a fourth circuit 14, a fifth circuit 15, a sixth circuit 16, a seventh circuit 17, an eighth circuit 18, an input node 51, a reference potential node 31, and an output node 61.

The first circuit 11 and the second circuit 12 are as described in the first embodiment. A size parameter of a third transistor 131 included in the third circuit 13 is equal to the sum of the size parameter a of the first transistor 111, the size parameter b of the second transistor 121, and a size parameter c of a seventh transistor 171 included in the seventh circuit 17. That is, the size parameter of the third transistor 131 is a+b+c.

The fourth circuit 14 includes a fourth transistor 141. The fourth transistor 141 is, for example, an n-channel transistor, and is connected between an input node 32 through which the input current $I_{IN}$ flows and the reference potential node 31. The gate electrode of the fourth transistor 141 is connected to the input node 32. The drain electrode and source electrode of the fourth transistor 141 are connected to the input node 32 and the reference potential node 31, respectively. The size parameter of the fourth transistor 141 is a.

The fifth circuit 15 includes a fifth transistor 151 and a low-pass filter circuit 157. The fifth transistor 151 is, for example, an n-channel transistor, and is connected in parallel to the fourth transistor 141 between the input node 32 through which the input current $I_{IN}$ flows and the reference potential node 31. The gate electrode of the fifth transistor 151 is connected to the fourth transistor 141 via the low-pass filter circuit 157. The drain electrode and source electrode of the fifth transistor 151 are connected to the input node 32 and the reference potential node 31, respectively. The size parameter of the fifth transistor 151 is b.

The low-pass filter circuit 157 includes a capacitor 1571 and a resistor 1572. The function of the low-pass filter circuit 157 is similar to that of the low-pass filter circuit 127.

The sixth circuit 16 includes a sixth transistor 161. The sixth transistor 161 is, for example, an n-channel transistor, and is connected between an output node 63 through which an output current $I_{ON}$ flows and the reference potential node 31. The gate electrode of the sixth transistor 161 is connected to the gate electrode of the fourth transistor 141. The drain electrode and source electrode of the sixth transistor 161 are connected to the output node 63 and the reference potential node 31, respectively. A size parameter of the sixth transistor 161 is equal to the sum of the size parameter a of the fourth transistor 141, the size parameter b of the fifth transistor 151, and a size parameter c of an eighth transistor 181 included in the eighth circuit 18. That is, the size parameter of the sixth transistor 161 is a+b+c.

The seventh circuit 17 includes the seventh transistor 171. The seventh transistor 171 is, for example, an n-channel transistor, and is connected between an input node 53 through which the input current $I_{IN}$ flows and the reference potential node 31. In addition, the gate electrode of the seventh transistor 171 is connected to the gate electrode of the first transistor 111. The size parameter of the seventh transistor 171 is c.

The eighth circuit 18 includes the eighth transistor 181. The eighth transistor 181 is, for example, an n-channel transistor, and is connected between the input node 51 through which the input current lip flows and the reference potential node 31. In addition, the gate electrode of the eighth transistor 181 is connected to the gate electrode of the fourth transistor 141. The size parameter of the eighth transistor 181 is c.

The first circuit 11, the second circuit 12, the third circuit 13, and the seventh circuit 17 operate as a first current mirror circuit CM1 that receives the input currents $I_{IP}$ and $I_{IN}$ from the input terminals 50 and 52 and outputs the output current $I_{OP}$ from the output terminal 60. The fourth circuit 14, the fifth circuit 15, the sixth circuit 16, and the eighth circuit 18 operate as a second current mirror circuit CM2 that receives the input currents $I_{IP}$ and $I_{IN}$ from the input terminals 50 and 52 and outputs the output current $I_{ON}$ from the output terminal 62.

The first current mirror circuit CM1 and the second current mirror circuit CM2 are cross-coupled by the seventh transistor 171 of the seventh circuit 17 to which the input current $I_{IN}$ is input and the eighth transistor 181 of the eighth circuit 18 to which the input current $I_{IP}$ is input.

Figure 6:
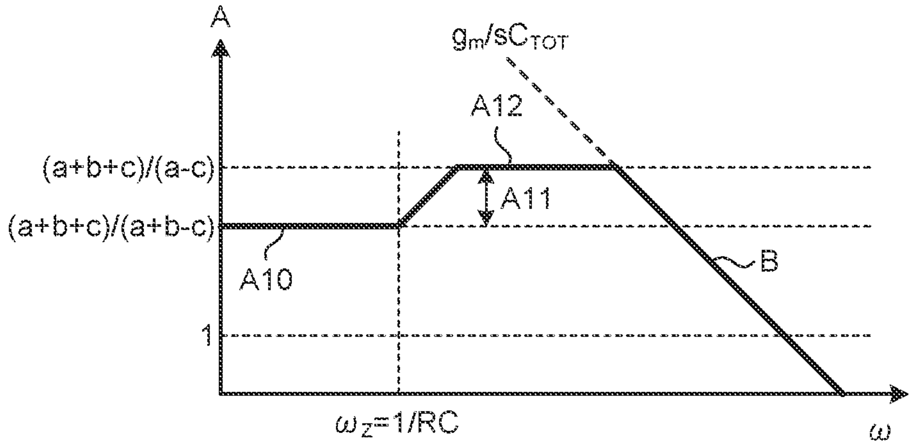
FIG. 6 is a diagram illustrating a relationship between a DC gain, a boost gain, a peak gain, and a frequency of the amplifier circuit according to the third embodiment.

FIG. 6 is a diagram illustrating frequency characteristics related to the gain of the amplifier circuit D3 according to the third embodiment. The operation of the amplifier circuit D3 will be described with reference to FIGS. 5 and 6.

First, a case where the frequency ω of the input currents $I_{IP}$ and $I_{IN}$ as an input signal satisfies $w\ \omega_z = 1/RC$ in the first current mirror circuit CM1 (that is, the frequency is equal to or lower than the cutoff frequency $\omega_z$ of the low-pass filter circuit 127) is assumed. In such a case, the input signal passes through the low-pass filter circuit 127. Therefore, when the input current $I_{IP}$ is input to the input node 51, a current $I_a$ in a ratio corresponding to the size parameter a of the first transistor 111 flows through the first circuit 11, and a current $I_b$ in a ratio corresponding to the size parameter b of the second transistor 121 flows through the second circuit 12.

In addition, when the input current $I_{IN}$ is input to the input node 53, the polarity of the input current $I_{IN}$ is inverted from the polarity of the input current $I_{IP}$, and thus, a current $-I_c$ in a ratio corresponding to the size parameter c of the seventh transistor 171 flows through the seventh circuit 17.

In the third transistor 131, the first transistor 111, the second transistor 121, and the seventh transistor 171, the voltages between the gates and the sources are equal. Therefore, a drain current $I_{a+b+c}$ flows through the third transistor 131.

The operation of the second current mirror circuit CM2 is also substantially the same except that the input currents $I_{IP}$ and $I_{IN}$ whose polarities are inverted are input.

Therefore, the DC gain in a case where the input signal has a low frequency is $A10=I_{a+b+c}/(I_a+I_b-I_c)=(a+b+c)/(a+b-c)$ as illustrated in FIG. 6.

In addition, a case where the frequency ω of the input currents $I_{IP}$ and $I_{IN}$ as the input signal has a relationship of $w>\omega_z=1/RC$ (that is, a case where the frequency is higher than the cutoff frequency $\omega_z$ of the low-pass filter circuit 127) is assumed. In such a case, when the input current $I_{IP}$ is input to the input node 51, the drain current $I_{a+b+c}$ flows through the third transistor 131 as a mirror destination based on a current mirror operation. At this time, the current $I_a$ in the ratio corresponding to the size parameter a of the first transistor 111 flows through the first circuit 11. The current $-I_c$ in the ratio corresponding to the size parameter c of the seventh transistor 171 flows through the seventh circuit 17.

On the other hand, the gate electrode of the second transistor 121 is connected to the gate electrode of the first transistor 111 via the low-pass filter circuit 127. As a result, since the input signal to the gate electrode of the second transistor 121 is filtered by the low-pass filter circuit 127, the current $I_b$ does not flow through the second transistor 121.

The operation of the second current mirror circuit CM2 is also substantially the same except that the input currents $I_{IP}$ and $I_{IN}$ whose polarities are inverted are input.

Therefore, as illustrated in FIG. 6, in a case where the frequency ω of the input signal$>\omega_z=1/RC$, the gain increases from the DC gain by the boost gain A11 in a certain high frequency range in which the frequency ω of the input signal satisfies $\omega_z>1/RC$. As a result, the peak gain becomes $A12=I_{a+b+c}/(I_a-I_c)=(a+b+c)/(a-c)$ as illustrated in FIG. 6.

As described above, the amplifier circuit D3 according to the present embodiment includes the first circuit 11, the second circuit 12, the third circuit 13, the fourth circuit 14, the fifth circuit 15, the sixth circuit 16, the seventh circuit 17, and the eighth circuit 18. The first circuit 11 includes the first transistor 111 connected between the input node 51 through which the input current $I_{IP}$ flows and the reference potential node 31, and having the gate electrode connected to the input node 51. The second circuit 12 includes the low-pass filter circuit 127. The second circuit 12 includes the second transistor 121 connected in parallel to the first transistor 111 between the input node 51 and the reference potential node 31, and having the gate electrode connected to the gate electrode of the first transistor 111 via the low-pass filter circuit 127. The third circuit 13 includes the third transistor 131 connected between the output node 61 through which the output current flows and the reference potential node 31, and having the gate electrode connected to the first transistor 111.

The fourth circuit 14 includes the fourth transistor 141 connected between the input node 53 through which the input current $I_{IN}$ flows and the reference potential node 31, and having the gate electrode connected to the input node 53. The fifth circuit 15 includes the low-pass filter circuit 157. The fifth circuit 15 includes the fifth transistor 151 connected in parallel to the fourth transistor 141 between the input node 53 and the reference potential node 31, and having the gate electrode connected to the gate electrode of the fourth transistor 141 via the low-pass filter circuit 157. The sixth circuit 16 includes the sixth transistor 161 connected between the output node 63 through which the output current flows and the reference potential node 31, and having the gate electrode connected to the fourth transistor 141.

The seventh circuit 17 includes the seventh transistor 171 connected between the input node 53 through which the input current $I_{IN}$ flows and the reference potential node 31, and having the gate electrode connected to the gate electrode of the first transistor 111. The eighth circuit 18 includes the eighth transistor 181 connected between the input node 51 through which the input current $I_{IP}$ flows and the reference potential node 31, and having the gate electrode connected to the gate electrode of the fourth transistor 141.

The first circuit 11, the second circuit 12, the third circuit 13, and the seventh circuit 17 operate as the first current mirror circuit CM1, and the fourth circuit 14, the fifth circuit 15, the sixth circuit 16, and the eighth circuit 18 operate as the second current mirror circuit CM2. The first current mirror circuit CM1 and the second current mirror circuit CM2 are cross-coupled by the seventh transistor 171 of the seventh circuit 17 and the eighth transistor 181 of the eighth circuit 18.

The input current $I_{IN}$ is cross-coupled with the input current $I_{IP}$ in the first current mirror circuit CM1 and the second current mirror circuit 17 and the eight transistor 181 of the eight circuit 18. As a result, the amplifier circuit D3 can have a function of amplifying the DC gain in addition to the boost gain amplification function described in the first embodiment.

Fourth Embodiment

Figure 7:
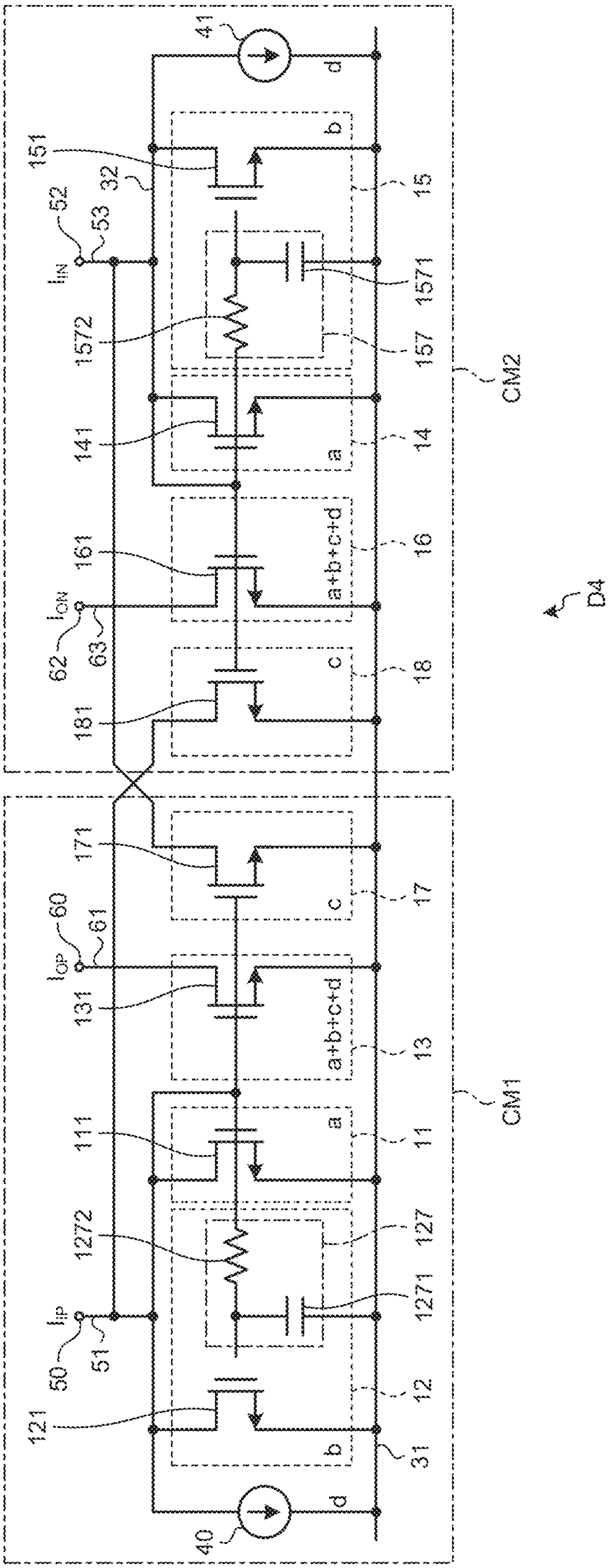
FIG. 7 is a diagram illustrating a configuration of an amplifier circuit according to a fourth embodiment.

FIG. 7 is a diagram illustrating a configuration of an amplifier circuit D4 according to a fourth embodiment. As illustrated in FIG. 7, in addition to the configuration of the amplifier circuit D3 illustrated in FIG. 5, the amplifier circuit D4 further includes constant current sources 40 and 41 corresponding to a size parameter d on the input node 51 side and the input node 53 side, respectively. The constant current source 40 is connected in parallel to the first transistor 111 and the second transistor 121 between the input node 51 and the reference potential node 31. The constant current source 41 is connected in parallel to the fourth transistor 141 and the fifth transistor 151 between the input node 53 and the reference potential node 31. Further, in the amplifier circuit D4, the size parameters of the third transistor 131 and the sixth transistor 161 are a+b+c+d on the output nodes 61 and 63 side, corresponding to the addition of the constant current sources 40 and 41.

As a result, the amplifier circuit D4 according to the fourth embodiment can further amplify the DC gain as compared with the amplifier circuit D3, similarly to the case of the amplifier circuit D2 according to the second embodiment. In addition, the boost gain and the DC gain can be variably amplified by adjusting currents Id output from the constant current sources 40 and 41.

Fifth Embodiment

Figure 8:
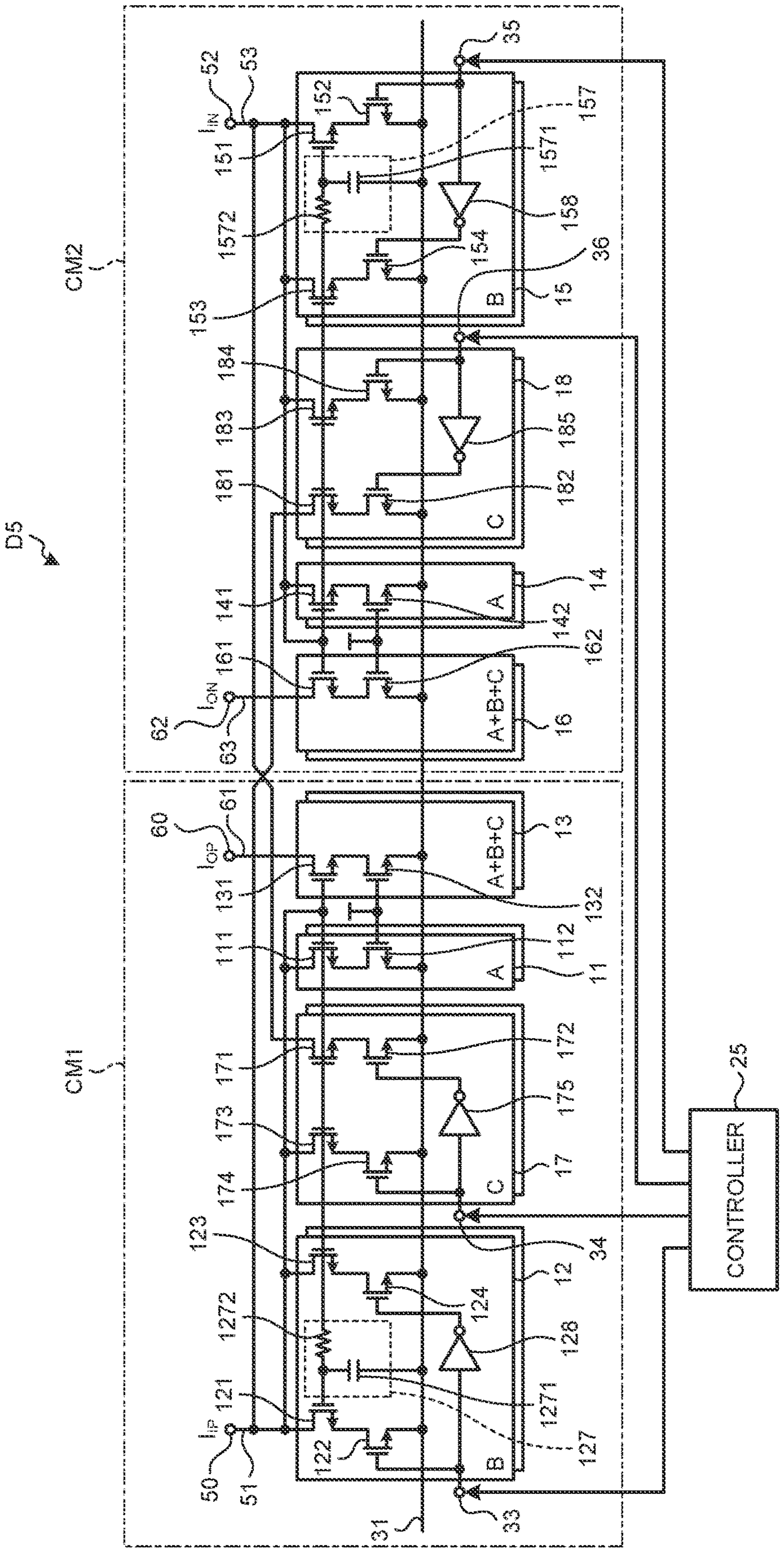
FIG. 8 is a diagram illustrating a configuration of an amplifier circuit according to a fifth embodiment.

FIG. 8 is a diagram illustrating a configuration of an amplifier circuit D5 according to a fifth embodiment. The amplifier circuit D5 according to the fifth embodiment individually controls size parameters a, b, and c using transistors for on/off control inserted into the source sides of the respective transistors included in the first current mirror circuit CM1 and the second current mirror circuit CM2, and variably amplifies the DC gain and the boost gain.

As illustrated in FIG. 8, the amplifier circuit D5 is a differential amplifier that receives input currents $I_{IP}$ and $I_{IN}$ and outputs output currents $I_{OP}$ and $I_{ON}$.

The amplifier circuit D5 includes A first circuits 11 connected in parallel (hereinafter, referred to as a "first circuit group").

The amplifier circuit D5 includes B second circuits 12 connected in parallel to each other (hereinafter, referred to as a "second circuit group").

The amplifier circuit D5 includes C seventh circuits 17 connected in parallel to each other (hereinafter, referred to as a "seventh circuit group").

The amplifier circuit D5 includes A+B+C third circuits 13 connected in parallel to each other (hereinafter, referred to as a "third circuit group"). The number of third circuits 13 included in the third circuit group is equal to the sum of the number of first circuits 11 included in the first circuit group, the number of second circuits 12 included in the second circuit group, and the number of seventh circuits 17 included in the seventh circuit group. Here, A, B and C are integers indicating the number of pieces with regard to corresponding circuits, respectively.

The amplifier circuit D5 includes A fourth circuits 14 connected in parallel to each other (hereinafter, referred to as a "fourth circuit group").

The amplifier circuit D5 includes B fifth circuits 15 connected in parallel to each other (hereinafter, referred to as a "fifth circuit group").

The amplifier circuit D5 includes C eighth circuits 18 connected in parallel to each other (hereinafter, referred to as an "eighth circuit group").

The amplifier circuit D5 includes A+B+C sixth circuits 16 connected in parallel to each other (hereinafter, referred to as a "sixth circuit group"). The number of sixth circuits included in the sixth circuit group is equal to the sum of the number of fourth circuits 14 included in the fourth circuit group, the number of fifth circuits 15 included in the fifth circuit group, and the number of eighth circuits 18 included in the eighth circuit group.

The first circuit group, the second circuit group, and the seventh circuit group constitute a first current mirror circuit CM1 with the third circuit group. The fourth circuit group, the fifth circuit group, and the sixth circuit group constitute a second current mirror circuit CM2 with the eighth circuit group. The amplifier circuit D5 includes a controller 25.

Each of the first circuits 11 includes a ninth transistor 112 connected in series to the first transistor 111. The ninth transistor 112 is, for example, an n-channel transistor, and the drain electrode of the ninth transistor 112 is connected to the source electrode of the first transistor 111. The source electrode of the ninth transistor 112 is connected to the reference potential node 31. The gate electrode of the ninth transistor 112 is connected to a predetermined fixed potential node, for example, a power supply potential node. The size parameter of the first transistor 111 is "1". The A first transistors 111 connected in parallel in the first circuit group constitute a part of a group of transistors that cause a current $I_a$ in a ratio corresponding to the size parameter a to flow.

Each of the second circuits 12 includes, in addition to the second transistor 121 and the low-pass filter circuit 127, a tenth transistor 122 for on/off control, an eleventh transistor 123, a twelfth transistor 124 for on/off control, and a first inverter 128.

The tenth transistor 122 is, for example, an n-channel transistor, and is connected between the second transistor 121 and the reference potential node 31. The drain electrode of the tenth transistor 122 is connected to the source electrode of the second transistor 121. The source electrode of the tenth transistor 122 is connected to the reference potential node 31. The gate electrode of the tenth transistor 122 is connected to a first control node 33. The size parameter of the second transistor 121 is "1". The B second transistors 121 connected in parallel in the second circuit group constitute a part of a group of transistors that cause a current $I_b$ in a ratio corresponding to the size parameter b to flow when turned on.

The eleventh transistor 123 is, for example, an n-channel transistor, and is connected in parallel to the first transistor 111 and the second transistor 121 between the input node 51 and the reference potential node 31. The drain electrode of the eleventh transistor 123 is connected to the input node 51. The source electrode of the eleventh transistor 123 is connected to the drain electrode of the twelfth transistor 124. The gate electrode of the eleventh transistor 123 is connected to the gate electrode of the first transistor 111 without via the low-pass filter circuit 127. The size parameter of the eleventh transistor 123 is "1". The B eleventh transistors 123 connected in parallel in the second circuit group constitute a part of the group of the transistors that cause the current $I_a$ in the ratio corresponding to the size parameter a to flow when turned on.

The twelfth transistor 124 is, for example, an n-channel transistor, and is connected between the eleventh transistor 123 and the reference potential node 31. The source electrode of the twelfth transistor 124 is connected to the reference potential node 31.

The input side of the first inverter 128 is connected to the gate electrode of the tenth transistor 122, that is, the first control node 33. The output side of the first inverter 128 is connected to the gate electrode of the twelfth transistor 124. The first inverter 128 selectively turns on any one of the tenth transistor 122 and the twelfth transistor 124 in accordance with a control signal to be input to the first inverter 128.

It is assumed that, in the second circuit 12, a control signal (for example, a high-level signal) for turning on the tenth transistor 122 to cause a current to flow to the second transistor 121 is supplied from the controller 25 to the first control node 33. In such a case, the tenth transistor 122 is turned on by the high-level signal, and a current $I_1$ in a ratio corresponding to the size parameter "1" flows through the second transistor 121.

On the other hand, the high-level signal is also supplied to the first inverter 128. The first inverter 128 supplies a low-level signal obtained by inverting the supplied high-level signal to the gate electrode of the twelfth transistor 124. The twelfth transistor 124 is not turned on because the control signal supplied to the gate electrode is a low-level signal.

In addition, it is assumed that a control signal (for example, a low-level signal) for turning off the tenth transistor 122 is supplied from the controller 25 to the first control node 33. In such a case, the tenth transistor 122 is turned off by the low-level signal, and the current $I_1$ does not flow through the second transistor 121.

On the other hand, the low-level signal is also supplied to the first inverter 128. The first inverter 128 supplies a high-level signal obtained by inverting the supplied low-level signal to the gate electrode of the twelfth transistor 124. The twelfth transistor 124 is turned on because the control signal supplied to the gate electrode is a high-level signal, and the current $I_1$ in the ratio corresponding to the size parameter "1" flows through the eleventh transistor 123.

Each of the seventh circuits 17 includes a seventh transistor 171, a thirteenth transistor 172, a fourteenth transistor 173, a fifteenth transistor 174, and a second inverter 175.

The seventh transistor 171 is, for example, an n-channel transistor, and is connected in parallel to the fourth transistor 141 and the fifth transistor 151 between the input node 53 and the reference potential node 31. The drain electrode of the seventh transistor 171 is connected to the input node 53. The source electrode of the seventh transistor 171 is connected to the drain electrode of the thirteenth transistor 172. The gate electrode of the seventh transistor 171 is connected to the gate electrode of the first transistor 111. The size parameter of the seventh transistor 171 is "1". The C seventh transistors 171 connected in parallel in the seventh circuit group constitute a part of a group of transistors that cause a current $-I_c$ in a ratio corresponding to the size parameter c to flow when turned on.

The thirteenth transistor 172 is, for example, an n-channel transistor, and is connected between the seventh transistor 171 and the reference potential node 31. The source electrode of the thirteenth transistor 172 is connected to the reference potential node 31.

The fourteenth transistor 173 is, for example, an n-channel transistor, and is connected in parallel to the first transistor 111 and the second transistor 121 between the input node 51 and the reference potential node 31. The drain electrode of the fourteenth transistor 173 is connected to the input node 51. The source electrode of the fourteenth transistor 173 is connected to the drain electrode of the fifteenth transistor 174. The gate electrode of the fourteenth transistor 173 is connected to the gate electrode of the first transistor 111. The size parameter of the fourteenth transistor 173 is "1". The C fourteenth transistors 173 connected in parallel in the seventh circuit group constitute a part of the group of the transistors that cause the current $I_a$ in the ratio corresponding to the size parameter a to flow when turned on.

The fifteenth transistor 174 is, for example, an n-channel transistor, and is connected between the fourteenth transistor 173 and the reference potential node 31. The source electrode of the fifteenth transistor 174 is connected to the reference potential node 31. The gate electrode of the fifteenth transistor 174 is connected to a second control node 34.

The input side of the second inverter 175 is connected to the gate electrode of the fifteenth transistor 174, that is, the second control node 34. The output side of the second inverter 175 is connected to the gate electrode of the thirteenth transistor 172. The second inverter 175 selectively turns on any one of the thirteenth transistor 172 and the fifteenth transistor 174 in accordance with a control signal to be input to the second inverter 175.

It is assumed that, in the seventh circuit 17, a high-level signal for turning on the fifteenth transistor 174 to cause a current to flow to the fourteenth transistor 173 is supplied from the controller 25 to the second control node 34. In such a case, the fifteenth transistor 174 is turned on by the high-level signal, and a current $I_1$ in the ratio corresponding to the size parameter "1" flows through the fourteenth transistor 173.

On the other hand, the high-level signal is also supplied to the second inverter 175. The second inverter 175 supplies a low-level signal obtained by inverting the supplied high-level signal to the gate electrode of the thirteenth transistor 172. The thirteenth transistor 172 is not turned on because the control signal supplied to the gate electrode is a low-level signal.

In addition, it is assumed that a low-level signal for turning off the fourteenth transistor 173 is supplied from the controller 25 to the second control node 34. In such a case, the fifteenth transistor 174 is turned off by the low-level signal, and the current $I_1$ does not flow through the fourteenth transistor 173.

On the other hand, the low-level signal is also supplied to the second inverter 175. The second inverter 175 supplies a high-level signal obtained by inverting the supplied low-level signal to the gate electrode of the thirteenth transistor 172. The thirteenth transistor 172 is turned on because the control signal supplied to the gate electrode is a high-level signal, and the current $I_1$ in the ratio corresponding to the size parameter "1" flows through the seventh transistor 171.

Each of the third circuits 13 includes a sixteenth transistor 132 connected between the third transistor 131 and the reference potential node 31. The sixteenth transistor 132 is, for example, an n-channel transistor, and the drain electrode of the sixteenth transistor 132 is connected to the source electrode of the third transistor 131. The source electrode of the sixteenth transistor 132 is connected to the reference potential node 31. The gate electrode of the sixteenth transistor 132 is connected to a predetermined fixed potential node, for example, the power supply potential node. The size parameter of the third transistor 131 is "1". The A+B+C third transistors 131 connected in parallel in the third circuit group constitute a part of a group of transistors that cause a current $I_{a+b+c}$ in a ratio corresponding to the size parameter a+b+c to flow when turned on.

As described above, in the amplifier circuit D5 illustrated in FIG. 8, the size parameters of the first transistor 111, the second transistor 121, the third transistor 131, the seventh transistor 171, the eleventh transistor 123, and the fourteenth transistor 173 are all "1", and the sizes thereof are equal to each other.

Each of the fourth circuits 14 includes a seventeenth transistor 142 connected between the fourth transistor 141 and the reference potential node 31. The seventeenth transistor 142 is, for example, an n-channel transistor, and the drain electrode of the seventeenth transistor 142 is connected to the source electrode of the fourth transistor 141. The source electrode of the seventeenth transistor 142 is connected to the reference potential node 31. The gate electrode of the seventeenth transistor 142 is connected to a predetermined fixed potential node, for example, the power supply potential node. The size parameter of the fourth transistor 141 is "1". The A fourth transistors 141 connected in parallel in the fourth circuit group constitute a part of a group of transistors that cause a current $-I_a$ in the ratio corresponding to the size parameter a to flow.

Each of the fifth circuits 15 includes, in addition to the fifth transistor 151 and the low-pass filter circuit 157, an eighteenth transistor 152, a nineteenth transistor 153, a twentieth transistor 154, and a third inverter 158.

The eighteenth transistor 152 is, for example, an n-channel transistor, and is connected between the fifth transistor 151 and the reference potential node 31. The drain electrode of the eighteenth transistor 152 is connected to the source electrode of the fifth transistor 151. The source electrode of the eighteenth transistor 152 is connected to the reference potential node 31. The gate electrode of the eighteenth transistor 152 is connected to a third control node 35. The size parameter of the fifth transistor 151 is "1". The B fifth transistors 151 connected in parallel in the fifth circuit group constitute a part of a group of transistors that cause a current $-I_b$ in the ratio corresponding to the size parameter b to flow when turned on.

The nineteenth transistor 153 is, for example, an n-channel transistor, and is connected in parallel to the fourth transistor 141 and the fifth transistor 151 between the input node 53 and the reference potential node 31. The drain electrode of the nineteenth transistor 153 is connected to the input node 53. The source electrode of the nineteenth transistor 153 is connected to the drain electrode of the twentieth transistor 154. The gate electrode of the nineteenth transistor 153 is connected to the gate electrode of the fourth transistor 141 without via the low-pass filter circuit 157. The size parameter of the nineteenth transistor 153 is "1". The B nineteenth transistors 153 connected in parallel in the fifth circuit group constitute a part of the group of the transistors that cause the current $-I_a$ in the ratio corresponding to the size parameter a to flow when turned on.

The twentieth transistor 154 is, for example, an n-channel transistor, and is connected between the nineteenth transistor 153 and the reference potential node 31. The source electrode of the twentieth transistor 154 is connected to the reference potential node 31.

The input side of the third inverter 158 is connected to the gate electrode of the eighteenth transistor 152, that is, the third control node 35. The output side of the third inverter 158 is connected to the gate electrode of the twentieth transistor 154. The third inverter 158 selectively turns on any one of the eighteenth transistor 152 and the twentieth transistor 154 in accordance with a control signal to be input to the third inverter 158.

Since the switching control in the fifth circuits 15 is similar to that in the second circuits 12, the description thereof will be omitted.

Each of the eighth circuits 18 includes an eighth transistor 181, a twenty-first transistor 182, a twenty-second transistor 183, a twenty-third transistor 184, and a fourth inverter 185.

The eighth transistor 181 is, for example, an n-channel transistor, and is connected in parallel to the first transistor 111 and the second transistor 121 between the input node 51 and the reference potential node 31. The drain electrode of the eighth transistor 181 is connected to the input node 51. The source electrode of the eighth transistor 181 is connected to the drain electrode of the twenty-first transistor 182. The gate electrode of the eighth transistor 181 is connected to the gate electrode of the fourth transistor 141. The size parameter of the eighth transistor 181 is "1". The C eighth transistors 181 connected in parallel in the eighth circuit group constitute a part of a group of transistors that cause a current $I_c$ in the ratio corresponding to the size parameter c to flow when turned on.

The twenty-first transistor 182 is, for example, an n-channel transistor, and is connected between the eighth transistor 181 and the reference potential node 31. The source electrode of the twenty-first transistor 182 is connected to the reference potential node 31.

The twenty-second transistor 183 is, for example, an n-channel transistor, and is connected in parallel to the fourth transistor 141 and the fifth transistor 151 between the input node 53 and the reference potential node 31. The drain electrode of the twenty-second transistor 183 is connected to the input node 53. The source electrode of the twenty-second transistor 183 is connected to the drain electrode of the twenty-third transistor 184. The gate electrode of the twenty-second transistor 183 is connected to the gate electrode of the fourth transistor 141. The size parameter of the twenty-second transistor 183 is "1". The C twenty-second transistors 183 connected in parallel in the eighth circuit group constitute a part of the group of the transistors that cause the current $-I_a$ in the ratio corresponding to the size parameter a to flow when turned on.

The twenty-third transistor 184 is, for example, an n-channel transistor, and is connected between the twenty-second transistor 183 and the reference potential node 31. The source electrode of the twenty-third transistor 184 is connected to the reference potential node 31. The gate electrode of the twenty-third transistor 184 is connected to a fourth control node 36.

The input side of the fourth inverter 185 is connected to the gate electrode of the twenty-third transistor 184, that is, the fourth control node 36. The output side of the fourth inverter 185 is connected to the gate electrode of the twenty-first transistor 182. The fourth inverter 185 selectively turns on any one of the twenty-first transistor 182 and the twenty-third transistor 184 in accordance with a control signal to be input to the fourth inverter 185.

Since the switching control in the eighth circuits 18 is similar to that in the seventh circuits 17, the description thereof will be omitted.

Each of the sixth circuits 16 includes a twenty-fourth transistor 162 connected between the sixth transistor 161 and the reference potential node 31. The twenty-fourth transistor 162 is, for example, an n-channel transistor, and the drain electrode of the twenty-fourth transistor 162 is connected to the source electrode of the sixth transistor 161. The source electrode of the twenty-fourth transistor 162 is connected to the reference potential node 31. The gate electrode of the twenty-fourth transistor 162 is connected to a predetermined fixed potential node, for example, the power supply potential node. The size parameter of the sixth transistor 161 is "1". The A+B+C sixth transistors 161 connected in parallel in the sixth circuit group constitute a part of the group of the transistors that cause the current $I_{a+b+c}$ in the ratio corresponding to the size parameter a+b+c to flow when turned on.

As described above, in the amplifier circuit D5 illustrated in FIG. 8, the size parameters of the fourth transistor 141, the fifth transistor 151, the sixth transistor 161, the eighth transistor 181, the nineteenth transistor 153, and the twenty-second transistor 183 are all "1", and the sizes thereof are equal to each other.

The controller 25 is a control circuit that performs selective input of a plurality of first control signals to the second circuit group, selective input of a plurality of second control signals to the seventh circuit group, selective input of a plurality of third control signals to the fifth circuit group, and selective input of a plurality of fourth control signals to the eighth circuit group, in variable manners according to the DC gain to be set and the boost gain to be set.

In the amplifier circuit D5, the difference between the gain in a case where the frequency $\omega$ of the input currents $I_{IP}$ and $I_{IN}$ is higher than the cutoff frequency $\omega_z$ of the low-pass filter circuit 127 and the low-pass filter circuit 157 and the gain in a case where the frequency ω of the input currents $I_{IP}$ and $I_{IN}$ is lower than the cutoff frequency $\omega_z$ of the low-pass filter circuit 127 and the low-pass filter circuit 157 is determined according to the number of second transistors 121 to be turned on by the first control signals and the number of fifth transistors 151 to be turned on by the third control signals.

Furthermore, in the amplifier circuit D5, the gain in a case where the frequency ω of the input currents $I_{IP}$ and $I_{IN}$ is lower than the cutoff frequency $\omega_z$ of the low-pass filter circuit 127 and the low-pass filter circuit 157 is determined according to the number of seventh transistors 171 to be turned on by the second control signals and the number of eighth transistors 181 to be turned on by the fourth control signals.

Furthermore, in the amplifier circuit D5, the gain in a case where the frequency ω of the input currents $I_{IP}$ and $I_{IN}$ is higher than the cutoff frequency $\omega_z$ of the low-pass filter circuit 127 and the low-pass filter circuit 157 is larger than the gain in a case where the frequency ω of the input currents $I_{IP}$ and $I_{IN}$ is lower than the cutoff frequency $\omega_z$ of the low-pass filter circuit 127 and the low-pass filter circuit 157.

More specifically, the controller 25 supplies corresponding control signals to a plurality of first control nodes 33, a plurality of second control nodes 34, a plurality of third control nodes 35, and a plurality of fourth control nodes 36 according to the DC gain to be set and the boost gain to be set. The controller 25 stores a lookup table for determining the size parameters a, b, and c based on the DC gain to be set and the boost gain to be set. The controller 25 determines the values of the size parameters a, b, and c based on the DC gain to be set, the boost gain to be set, and the lookup table. The controller 25 supplies corresponding control signals for setting the determined values of the size parameters a, b, and c to the plurality of first control nodes 33, the plurality of second control nodes 34, the plurality of third control nodes 35, and the fourth control nodes 36.

Next, switching control of the first circuit 11 and the second circuit 12 in the first current mirror circuit CM1 will be described. This switching control is executed using the size parameters a, b, and c determined based on the level of the DC gain and the level of the boost gain.

First, the determination of the size parameters a, b, and c will be described. The size parameters a, b, and c are determined using the lookup table with the DC gain and the boost gain as input information and the values (that is, in the first current mirror circuit CM1, the number of transistors to be driven in order to cause a current in a ratio corresponding to each size parameter to flow) of the size parameters a, b, and c as output information.

FIGS. 9A, 9B, and 9C are lookup tables for determining the size parameters a, b, and c based on the DC gain to be set and the boost gain to be set. In each lookup table, EQ means the level of the boost gain, and VGA means the level of the DC gain. The lookup tables illustrated in FIGS. 9A, 9B, and 9C are examples in a case where A=8, B=14, C=10, and A+B+C=32.

For example, it is assumed that the level (EQ) of the boost gain is set to 3 and the level (VGA) of the DC gain is set to 8. In such a case, (a, b, c)=(19, 3, 10) is obtained according to the lookup tables of FIGS. 9A, 9B, and 9C.

At this time, since b=3, the controller 25 supplies a control signal (for example, a high-level signal) for turning on the tenth transistor 122 to cause a current to flow to the second transistor 121 to the first control nodes 33 in the 3 second circuits 12 among the B second circuits 12 connected in parallel and constituting the second circuit group. At this time, since b=3, the controller 25 supplies a control signal (for example, a high-level signal) for turning on the twelfth transistor 124 to cause a current to flow to the eleventh transistor 123 to the first control nodes 33 in the remaining 11 (B−b=11) second circuits 12 among the B second circuits 12 connected in parallel and constituting the second circuit group.

In addition, since c=10, the controller 25 supplies a control signal (for example, a low-level signal) for turning on the thirteenth transistor 172 to cause a current to flow to the seventh transistor 171 to the second control nodes 34 in all the 10 seventh circuits 17 among the C seventh circuits 17 connected in parallel and constituting the seventh circuit group. On the other hand, a control signal (for example, a high-level signal) for turning on the fifteenth transistor 174 to cause a current to flow to the fourteenth transistor 173 is not supplied to any of the seventh circuits 17.

That is, in a case where the level (EQ) of the boost gain is set to 3 and the level (VGA) of the DC gain is set to 8, it is necessary to set (a, b, c)=(19, 3, 10) from the lookup tables. This corresponds to, for example, the need for the following three types of control. First, in the mirror source of the first current mirror circuit CM1, it is necessary to generate the current $I_a$ corresponding to the size parameter a (=19) by turning on, in parallel, 19 transistors whose size parameters are "1" and whose gate electrodes are connected to the gate electrodes of the mirror destination transistors without via the low-pass filter circuit. In addition, it is necessary to generate the current $I_b$ in a ratio corresponding to the size parameter b (=3) by turning on, in parallel, 3 transistors whose size parameters are "1" and whose gate electrodes are connected to the gate electrodes of the mirror destination transistors via the low-pass filter circuit. Further, it is necessary to generate the current $-I_c$ in a ratio corresponding to the size parameter c (=10) by turning on, in parallel, 10 transistors whose size parameters are "1" and whose drain electrodes are connected to the input node different from the drain electrodes of the mirror destination transistors.

Therefore, the control of the controller 25 is to turn on the second transistors 121 whose size parameters are "1" in the 3 second circuits 12 among the 14 second circuits 12, and turn on the eleventh transistors 123 whose size parameters are "1" in the remaining 11 second circuits 12.

In the control of controller 25, the seventh transistor 171 having the size parameter "1" is turned on in each of the 10 seventh circuits 17 out of the 10 seventh circuits 17, and none of the fourteenth transistors 173 having the size parameter "1" is turned on in each of the 10 seventh circuits 17.

The 8 first circuits 11 are present, and the first transistors 111 whose size parameters are "1" are always in an on state. In addition, in the 11 second circuits 12, since the eleventh transistors 123 whose size parameters are "1" are turned on, a total of 19 (=8+11) transistors corresponding to the size parameter a=19 can be turned on.

As a result, in the mirror source of the first current mirror circuit CM1, the current $I_a$ in the ratio corresponding to the size parameter a=19, the current $I_b$ corresponding to the size parameter b=3, and the current $-I_c$ for the size parameter c=10 can be caused to flow.

The size parameters a, b, and c may be determined at any timing. For example, it can be performed at the time of activation of a device on which the amplifier circuit D5 is mounted, or the like.

The same applies to the determination of the size parameters a, b, and c in the second current mirror circuit CM2 and the switching control based on the determined size parameters a, b, and c, and thus the description thereof will be omitted.

As described above, according to the amplifier circuit D5 according to the present embodiment, by setting a desired DC gain and a desired boost gain (peak gain), the size parameters a, b, and c for enabling the setting can be automatically determined based on the lookup table. The amplifier circuit D5 can perform the switching control according to the determined size parameters a, b, and c to amplify the DC gain and the boost gain.

That is, the user can individually and variably set the DC gain and the boost gain. As a result, it is possible to further cope with multi-leveling of the signal amplitude level.

Sixth Embodiment

An amplifier circuit D6 according to a sixth embodiment can have a larger DC gain and a larger boost gain by connecting any of the amplifier circuits D1 to D5 in each of multiple stages.

Figure 10:
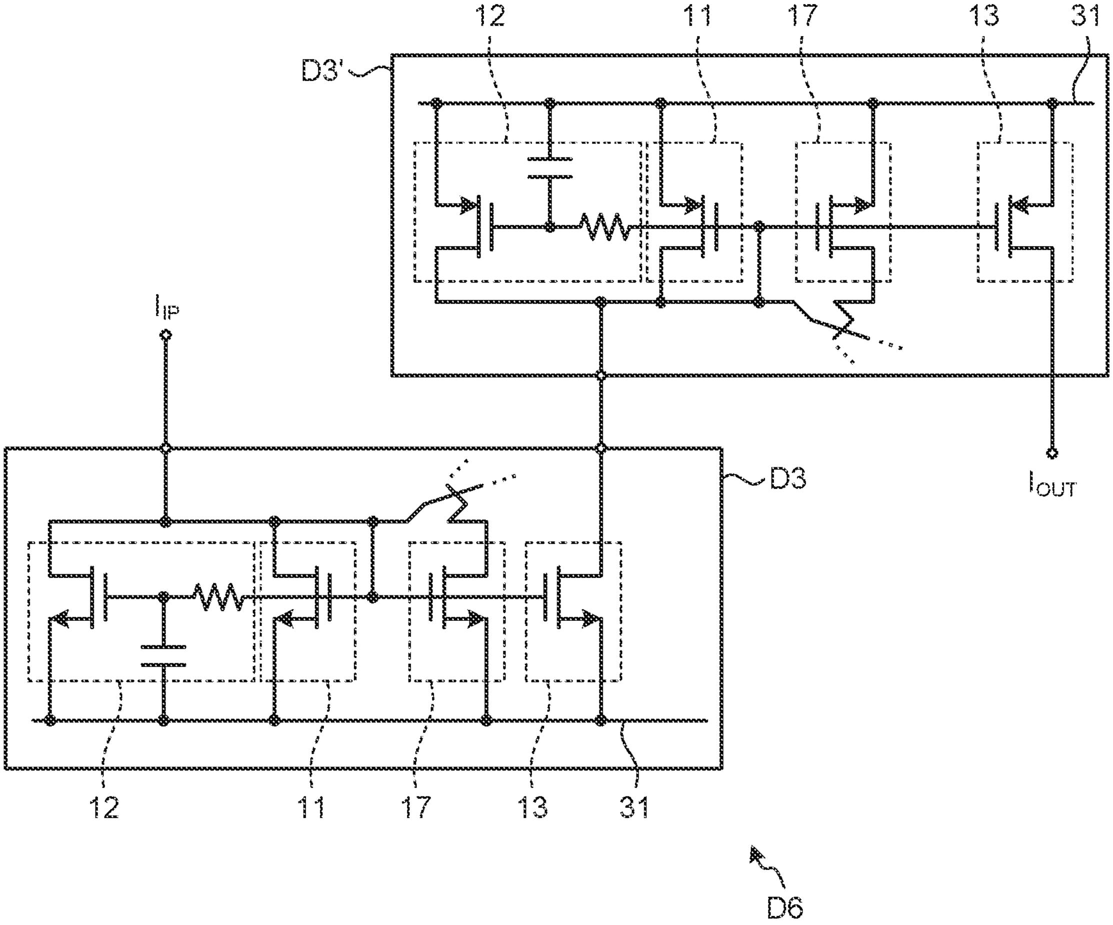
FIG. 10 is a diagram illustrating a configuration of an amplifier circuit according to a sixth embodiment.

FIG. 10 is a diagram illustrating a configuration of the amplifier circuit D6 according to the sixth embodiment, and illustrates a case where the amplifier circuits D3 are connected in two stages. In FIG. 10, the two-stage connection is implemented by connecting the output node of the amplifier circuit D3 including n-channel transistors to the input node of the amplifier circuit D3' configured by replacing the n-channel transistors of the amplifier circuit D3 with p-channel transistors.

As illustrated in FIG. 10, a larger DC gain and a larger boost gain can be obtained by connecting the amplifier circuits D3 in the plurality of stages while inverting the polarity of the circuit.

Seventh Embodiment

Figure 11:
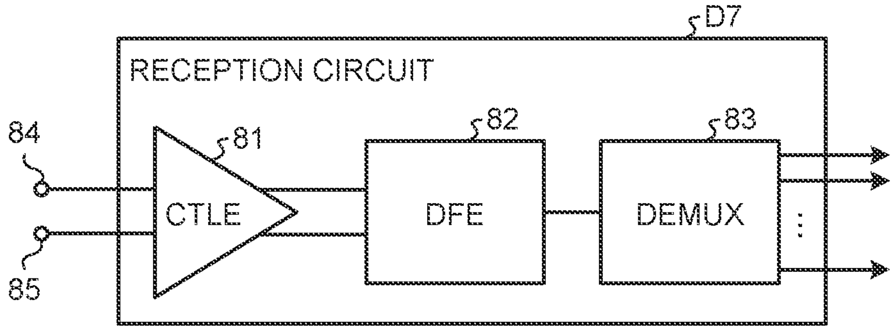
FIG. 11 is a diagram illustrating a configuration of a reception circuit according to a seventh embodiment.

FIG. 11 is a diagram illustrating a configuration of a reception circuit D7 according to a seventh embodiment. As illustrated in FIG. 11, the reception circuit D7 includes a CTLE 81, a decision feedback equalizer (DFE) 82, and a demultiplexer (DEMUX) 83.

The CTLE 81 is an input amplifier circuit that includes the respective amplifier circuits according to the first to sixth embodiments therein and continuously performs amplification processing and equalization processing on the time axis on differential input signals (serial input signals) received by differential input terminals 84 and 85. The DFE 82 is an equalization circuit that receives the output signal of the CTLE 81 and performs equalization processing by a feedback loop and determination of a signal level on the output signal of the CTLE 81. Note that the CTLE 81 and the DFE 82 are examples of input circuits. The DEMUX 83 is a conversion circuit that receives the output signal of the DFE 82 and performs conversion processing of converting the output signal of the DFE 82 from serial to parallel.

According to such a reception circuit D7, it is possible to implement a reception circuit having the effects of the amplifier circuits according to the first to sixth embodiments.

Eighth Embodiment

Figure 12:
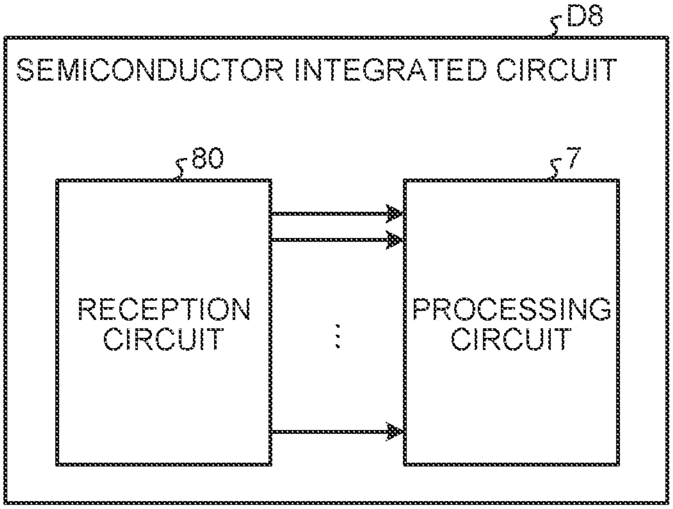
FIG. 12 is a diagram illustrating a configuration of a semiconductor integrated circuit according to an eighth embodiment.

FIG. 12 is a diagram illustrating a configuration of a semiconductor integrated circuit D8 according to an eighth embodiment. As illustrated in FIG. 12, the semiconductor integrated circuit D8 includes a reception circuit 80 and a processing circuit 7 that executes predetermined signal processing on an output signal of the reception circuit 80.

The reception circuit 80 is, for example, the reception circuit D7 illustrated in FIG. 11, and a CTLE 81 in the reception circuit 80 includes each of the amplifier circuits according to the first to sixth embodiments therein.

According to such a reception circuit, it is possible to implement a reception circuit having the effects of the amplifier circuits according to the first to sixth embodiments.

First Modification

In the first and second embodiments, the single-ended amplifier circuits D1 and D2 have been described. On the other hand, a differential amplifier circuit can be configured using the two amplifier circuits D1 and D2.

Second Modification

In each of the above-described embodiments, the amplifier circuits using the n-channel transistors, and the like have been exemplified. As a matter of course, the amplifier circuits and the like according to each embodiment can be implemented using p-channel transistors.

In addition to the above embodiments, the following notes are disclosed.

According to an embodiment disclosed in the present specification, it is possible to implement an amplifier circuit, a differential amplifier circuit, a reception circuit, and a semiconductor integrated circuit that enable a boost gain amplification function and have a small area while maintaining linearity of a gain.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An amplifier circuit including:

a first circuit including a first transistor connected between an input node through which an input current flows and a reference potential node, the first transistor having a gate electrode connected to the input node and being a first diode-connected transistor such that the gate electrode of the first transistor is connected to a drain electrode of the first transistor;

a second circuit including a low-pass filter circuit and a second transistor connected in parallel to the first transistor between the input node and the reference potential node, the second transistor having a gate electrode connected to the gate electrode of the first transistor via the low-pass filter circuit and being a second diode-connected transistor such that the gate electrode of the second transistor is connected to a drain electrode of the second transistor, the input current being an alternating current signal, a current value of the alternating current signal varying on a periodic basis at a determined frequency; and a third circuit including a third transistor connected between an output node through which an output current flows and the reference potential node, the third transistor having a gate electrode connected to the gate electrode of the first transistor.

2. The amplifier circuit according to claim 1, wherein the first circuit and the second circuit constitute a current mirror circuit with the third circuit.

3. The amplifier circuit according to claim 1, wherein the low-pass filter circuit includes:

a capacitor connected between the gate electrode of the second transistor and the reference potential node; and a resistor connected between the gate electrode of the second transistor and the gate electrode of the first transistor.

4. The amplifier circuit according to claim 1, wherein a size of the third transistor is equal to a sum of a size of the first transistor and a size of the second transistor.

5. The amplifier circuit according to claim 4, wherein each of the first transistor, the second transistor, and the third transistor is a planar transistor, and the sizes correspond to gate widths of the planar transistors.

6. The amplifier circuit according to claim 4, wherein each of the first transistor, the second transistor, and the third transistor is a FinFET, and the sizes correspond to the numbers of fins of the FinFETs.

7. The amplifier circuit according to claim 1, comprising a current source connected in parallel to the first transistor and the second transistor between the input node and the reference potential node.

8. The amplifier circuit according to claim 7, wherein a gain of the amplifier circuit in a case where a frequency of the input current is lower than a cutoff frequency of the low-pass filter circuit is determined according to a size of the current source.

9. The amplifier circuit according to claim 1, wherein a gain of the amplifier circuit in a case where a frequency of the input current is higher than a cutoff frequency of the low-pass filter circuit is larger than a gain of the amplifier circuit in a case where the frequency of the input current is lower than the cutoff frequency of the low-pass filter circuit.

10. The amplifier circuit according to claim 9, wherein a difference in gain of the amplifier circuit between a case where the frequency of the input current is higher than the cutoff frequency of the low-pass filter circuit and a case where the frequency of the input current is lower than the cutoff frequency of the low-pass filter circuit is determined according to a size of the second transistor.

11. A differential amplifier circuit including:

a first circuit including a first transistor connected between a first input node through which a first input current flows and a reference potential node, the first transistor having a gate electrode connected to the first input node and being a first diode-connected transistor such that the gate electrode of the first transistor is connected to a drain electrode of the first transistor;

a second circuit including a first low-pass filter circuit and a second transistor connected in parallel to the first transistor between the first input node and the reference potential node, the second transistor having a gate electrode connected to the gate electrode of the first transistor via the first low-pass filter circuit and being a second diode-connected transistor such that the gate electrode of the second transistor is connected to a drain electrode of the second transistor, the first input current being an alternating current signal, a current value of the alternating current signal of the first input current varying on a periodic basis at a determined frequency;

a third circuit including a third transistor connected between a first output node through which a first output current flows and the reference potential node, the third transistor having a gate electrode connected to the gate electrode of the first transistor;

a fourth circuit including a fourth transistor connected between a second input node through which a second input current flows and the reference potential node, the fourth transistor having a gate electrode connected to the second input node and being a third diode-connected transistor such that the gate electrode of the fourth transistor is connected to a drain electrode of the fourth transistor;

a fifth circuit including a second low-pass filter circuit and a fifth transistor connected in parallel to the fourth transistor between the second input node and the reference potential node, the fifth transistor having a gate electrode connected to the gate electrode of the fourth transistor via the second low-pass filter circuit and being a diode-connected transistor such that the gate electrode of the fifth transistor is connected to a drain electrode of the fifth transistor, the second input current being an alternating current signal, a current value of the alternating current signal of the second input current varying on a periodic basis at a determined frequency;

a sixth circuit including a sixth transistor connected between a second output node through which a second output current flows and the reference potential node, the sixth transistor having a gate electrode connected to the gate electrode of the fourth transistor;

a seventh circuit including a seventh transistor connected between the second input node and the reference potential node, the seventh transistor having a gate electrode connected to the gate electrode of the first transistor; and an eighth circuit including an eighth transistor connected between the first input node and the reference potential node, the eighth transistor having a gate electrode connected to the gate electrode of the fourth transistor.

12. The differential amplifier circuit according to claim 11, wherein the first circuit, the second circuit, and the seventh circuit constitute a first current mirror circuit with the third circuit, and the fourth circuit, the fifth circuit, and the eighth circuit constitute a second current mirror circuit with the sixth circuit.

13. The differential amplifier circuit according to claim 11, wherein the first low-pass filter circuit includes:

a first capacitor connected between the gate electrode of the second transistor and the reference potential node; and a first resistor connected between the gate electrode of the second transistor and the gate electrode of the first transistor, and the second low-pass filter circuit includes:

a second capacitor connected between the gate electrode of the fifth transistor and the reference potential node; and a second resistor connected between the gate electrode of the fifth transistor and the gate electrode of the fourth transistor.

14. The differential amplifier circuit according to claim 11, wherein a size of the third transistor is equal to a sum of a size of the first transistor, a size of the second transistor, and a size of the seventh transistor, and a size of the sixth transistor is equal to a sum of a size of the fourth transistor, a size of the fifth transistor, and a size of the eighth transistor.

15. The differential amplifier circuit according to claim 11, wherein the second circuit includes a tenth transistor connected between the second transistor and the reference potential node, an eleventh transistor connected in parallel to the second transistor between the first input node and the reference potential node, the eleventh transistor having a gate electrode connected to the gate electrode of the first transistor without via the first low-pass filter circuit, a twelfth transistor connected between the eleventh transistor and the reference potential node, and a first inverter in which one of an input side thereof and an output side thereof is connected to a gate electrode of the tenth transistor and in which the other of the input side and the output side is connected to a gate electrode of the twelfth transistor, the first inverter being configured to selectively turn on one of the tenth transistor and the twelfth transistor according to a first control signal to be input thereto, the seventh circuit includes a thirteenth transistor connected between the seventh transistor and the reference potential node, a fourteenth transistor connected in parallel to the seventh transistor between the first input node and the reference potential node, the fourteenth transistor having a gate electrode connected to the gate of the first transistor, a fifteenth transistor connected between the fourteenth transistor and the reference potential node, and a second inverter in which one of an input side thereof and an output side thereof is connected to a gate electrode of the fifteenth transistor and in which the other of the input side and the output side is connected to a gate electrode of the thirteenth transistor, the second inverter being configured to selectively turn on one of the thirteenth transistor and the fifteenth transistor according to a second control signal to be input thereto, the fifth circuit includes an eighteenth transistor connected between the fifth transistor and the reference potential node, a nineteenth transistor connected in parallel to the fifth transistor between the second input node and the reference potential node, the nineteenth transistor having a gate electrode connected to the gate of the fourth transistor without via the second low-pass filter circuit, a twentieth transistor connected between the nineteenth transistor and the reference potential node, and a third inverter in which one of an input side thereof and an output side thereof is connected to a gate electrode of the eighteenth transistor and in which the other of the input side and the output side is connected to a gate electrode of the twentieth transistor, the third inverter being configured to selectively turn on one of the eighteenth transistor and the twentieth transistor according to a third input control signal, and the eighth circuit includes a twenty-first transistor connected between the eighth transistor and the reference potential node, a twenty-second transistor connected in parallel to the eighth transistor between the second input node and the reference potential node, the twenty-second transistor having a gate electrode connected to the gate of the fourth transistor, a twenty-third transistor connected between the twenty-second transistor and the reference potential node, and a fourth inverter in which one of an input side thereof and an output side thereof is connected to a gate electrode of the twenty-third transistor and in which the other of the input side and the output side is connected to a gate electrode of the twenty-first transistor, the fourth inverter being configured to selectively turn on one of the twenty-first transistor and the twenty-third transistor according to a fourth control signal to be input thereto.

16. The differential amplifier circuit according to claim 15, wherein a first circuit group includes a plurality of the first circuits connected in parallel to each other, a second circuit group includes a plurality of the second circuits connected in parallel to each other, a seventh circuit group includes a plurality of the seventh circuits connected in parallel to each other, and a third circuit group includes a plurality of the third circuits, the first circuit group, the second circuit group and the seventh circuit group constitute a first current mirror circuit with the third circuit group, a fourth circuit group includes a plurality of the fourth circuits, a fifth circuit group includes a plurality of the fifth circuits, an eighth circuit group includes a plurality of the eighth circuits, and a sixth circuit group includes a plurality of the sixth circuits, the fourth circuit group, the fifth circuit group and the eighth circuit group constitute a second current mirror circuit with the sixth circuit group, and the differential amplifier circuit includes a control circuit that performs, in accordance with a DC gain and a boost gain, selective input of a plurality of the first control signals to the second circuit group, selective input of a plurality of the second control signals to the seventh circuit group, selective input of a plurality of the third control signals to the fifth circuit group, and selective input of a plurality of the fourth control signals to the eighth circuit group, in variable manners.

17. The differential amplifier circuit according to claim 16, wherein the DC gain is a gain of the amplifier circuit in a case where a frequency of the first input current is lower than a cutoff frequency of the first low-pass filter circuit and the second input current is lower than a cutoff frequency of the second low-pass filter circuit, and the boost gain is a gain of the amplifier circuit in a case where the frequency of the first input current is higher than the cutoff frequency of the first low-pass filter circuit and the frequency of the second input current is higher than the cutoff frequency of the second low-pass filter circuit.

18. The differential amplifier circuit according to claim 16, wherein the number of the third circuits included in the third circuit group is equal to a sum of the number of the first circuits included in the first circuit group, the number of the second circuits included in the second circuit group, and the number of the seventh circuits included in the seventh circuit group, and the number of the sixth circuits included in the sixth circuit group is equal to a sum of the number of the fourth circuits included in the fourth circuit group, the number of the fifth circuits included in the fifth circuit group, and the number of the eighth circuits included in the eighth circuit group.

19. The differential amplifier circuit according to claim 15, wherein sizes of the first transistor, the second transistor, the third transistor, the seventh transistor, the eleventh transistor, and the fourteenth transistor are equal to each other, and sizes of the fourth transistor, the fifth transistor, the sixth transistor, the eighth transistor, the nineteenth transistor, and the twenty-second transistor are equal to each other.

20. The differential amplifier circuit according to claim 15, wherein a difference in gain of the differential amplifier circuit between a case where frequencies of the first input current and the second input current are higher than cutoff frequencies of the first low-pass filter circuit and the second low-pass filter circuit and a case where the frequencies of the first input current and the second input current are lower than the cutoff frequencies of the first low-pass filter circuit and the second low-pass filter circuit is determined according to the number of the second transistors to be turned on by the first control signal and the number of the fifth transistors to be turned on by the third control signal.

21. The differential amplifier circuit according to claim 15, wherein a gain of the differential amplifier circuit in a case where frequencies of the first input current and the second input current are lower than cutoff frequencies of the first low-pass filter circuit and the second low-pass filter circuit is determined according to the number of the seventh transistors to be turned on by the second control signal and the number of the eighth transistors to be turned on by the fourth control signal.

22. The differential amplifier circuit according to claim 11, wherein a gain of the differential amplifier circuit in a case where frequencies of the first input current and the second input current are higher than cutoff frequencies of the first low-pass filter circuit and the second low-pass filter circuit is larger than a gain of the differential amplifier circuit in a case where the frequencies of the first input current and the second input current are lower than the cutoff frequencies of the first low-pass filter circuit and the second low-pass filter circuit.

23. The differential amplifier circuit according to claim 11, further including:

a first current source connected in parallel to the first transistor and the second transistor between the first input node and the reference potential node; and a second current source connected in parallel to the fourth transistor and the fifth transistor between the second input node and the reference potential node.

24. The differential amplifier circuit according to claim 23, wherein a gain of the differential amplifier circuit in a case where a frequency of the first input current is lower than a cutoff frequency of the first low-pass filter and a frequency of the second input current is lower than a cutoff frequency of the second low-pass filter.

25. An amplifier circuit obtained by connecting the amplifier circuits according to claim 1 in multiple stages.

26. A differential amplifier circuit obtained by connecting the differential amplifier circuits according to claim 11 in multiple stages.

27. A reception circuit including:

an input circuit that receives an input signal and performs equalization processing on the input signal, the input circuit including the amplifier circuit according to claim 1; and a conversion circuit that performs predetermined conversion processing on an output signal of the input circuit.

28. A reception circuit including:

an input circuit that receives an input signal and performs equalization processing on the input signal, the input circuit including the differential amplifier circuit according to claim 11; and a conversion circuit that performs predetermined conversion processing on an output signal of the input circuit.

29. A semiconductor integrated circuit including:

the reception circuit according to claim 27; and a processing circuit that performs predetermined signal processing on an output signal of the reception circuit.

30. A semiconductor integrated circuit including:

the reception circuit according to claim 28; and a processing circuit that performs predetermined signal processing on an output signal of the reception circuit.

* * * * *